(12) United States Patent
Momose et al.

(10) Patent No.: US 10,199,305 B2
(45) Date of Patent: Feb. 5, 2019

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Fumihiko Momose, Nagano (JP); Takashi Saito, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/908,509

(22) Filed: Feb. 28, 2018

(65) Prior Publication Data

US 2018/0190570 A1 Jul. 5, 2018

Related U.S. Application Data

(63) Continuation of application No. PCT/JP2017/010728, filed on Mar. 16, 2017.

(30) Foreign Application Priority Data

Mar. 31, 2016 (JP) ................................. 2016-070182

(51) Int. Cl.
*H01L 23/40* (2006.01)
*B23K 1/00* (2006.01)
(Continued)

(52) U.S. Cl.
CPC ............... *H01L 23/40* (2013.01); *B23K 1/00* (2013.01); *C21D 7/06* (2013.01); *H01L 21/4817* (2013.01); *H01L 21/4882* (2013.01); *H01L 23/041* (2013.01); *H01L 23/492* (2013.01); *H05K 7/20* (2013.01); *H01L 23/053* (2013.01); *H01L 23/3735* (2013.01); *H01L 23/49866* (2013.01)

(58) Field of Classification Search
None
See application file for complete search history.

(56) References Cited

U.S. PATENT DOCUMENTS

2004/0144561 A1 7/2004 Osanai et al.
2016/0225688 A1 8/2016 Saito et al.
(Continued)

FOREIGN PATENT DOCUMENTS

EP 1434266 A1 6/2004
JP 2001-230362 A 8/2001
(Continued)

*Primary Examiner* — Jack Chen
(74) *Attorney, Agent, or Firm* — Rabin & Berdo, P.C.

(57) ABSTRACT

In a semiconductor device, a plurality of small depressions are formed to overlap each other in a first joining region of a back surface of a heat releasing plate. A streaky scratch or the like created on the back surface of the heat releasing plate is removed or reduced, by forming the small depressions overlapping each other on the heat releasing plate. In addition, when the small depressions are formed in the first joining region of the back surface of the heat releasing plate, the hardness of the first joining region of the back surface increases. Hence, the scratch is prevented from being created on the back surface of the heat releasing plate on which the depressions are formed to overlap each other in the first joining region of the back surface.

5 Claims, 10 Drawing Sheets

(51) Int. Cl.
*H05K 7/20* (2006.01)
*C21D 7/06* (2006.01)
*H01L 21/48* (2006.01)
*H01L 23/04* (2006.01)
*H01L 23/492* (2006.01)
*H01L 23/373* (2006.01)
*H01L 23/053* (2006.01)
*H01L 23/498* (2006.01)

(56) References Cited

U.S. PATENT DOCUMENTS

2017/0367213 A1* 12/2017 Yokoyama ............... H01L 23/40
2018/0190570 A1* 7/2018 Momose .................. C21D 7/06

FOREIGN PATENT DOCUMENTS

| JP | 2003-152141 A | 5/2003 |
| JP | 2004-214284 A | 7/2004 |
| JP | 2006-332084 A | 12/2006 |
| JP | 2008-117833 A | 5/2008 |
| JP | 2015-115383 A | 6/2015 |
| WO | WO-2015/141384 A1 | 9/2015 |

* cited by examiner

SEMICONDUCTOR DEVICE AND METHOD OF MANUFACTURING SEMICONDUCTOR DEVICE

CROSS-REFERENCE TO RELATED APPLICATION

This application is a continuation application of International Application PCT/JP2017/010728 filed on Mar. 16, 2017 which designated the U.S., which claims priority to Japanese Patent Application No. 2016-070182, filed on Mar. 31, 2016, the entire contents of which are incorporated herein by reference.

BACKGROUND OF THE INVENTION

1. Field of the Invention

The embodiments discussed herein relate to a semiconductor device and a method of manufacturing the semiconductor device.

2. Background of the Related Art

A power semiconductor device used as an electric power converter device or the like includes a laminate substrate including a semiconductor chip and an electrical insulating board including a circuit board on a front surface and a metal plate on a back surface. The semiconductor chip is mounted on the circuit board with solder in between. Also, in the power semiconductor device, a heat releasing plate is provided on the laminate substrate with solder in between. The power semiconductor device is formed by containing the above configuration in a case, and a heat releaser is additionally attached to the back surface of the heat releasing plate with heat releasing material, such as thermal compound, in between. Also, in the power semiconductor device, the semiconductor chip, the laminate substrate, and the heat releasing plate are heated to form solder joints therebetween. In this case, a thermal expansion coefficient is different between the members, and thus deflection occurs in the heat releasing plate. If a gap is created between the deflected heat releasing plate and the heat releaser, the thickness of the heat releasing material becomes uneven, and variation occurs in the heat conduction from the heat releasing plate to the heat releaser, and the heat releasing property deteriorates.

Thus, the deflection of the heat releasing plate is controlled by forming a work hardened layer in the heat releasing plate. There is a known method to prevent the deterioration of the heat releasing property by bringing the heat releasing plate and the heat releaser in close contact with each other to even the thickness of the heat releasing material (for example, refer to Japanese Laid-open Patent Publication No. 2004-214284).

By the way, in the procedure of manufacturing the power semiconductor device, a dent, such as a scratch, is sometimes created on the back surface of the heat releasing plate by some reasons, such as handling. In particular, when the heat releaser is attached to the heat releasing plate having a streaky scratch with the heat releasing material in between, the heat releasing material is unable to enter into the scratch. As a result, the scratch becomes an air gap, and air enters into the scratch.

Even if the power semiconductor device is driven and generates heat under the above condition, the air gap of the scratch prevents heat conduction, and the heat releasing property of the power semiconductor device deteriorates.

Further, it is concerned that, when the power semiconductor device generates heat, a part of the heat releasing material is pushed out (pumped out) to the outside along the scratch as the heat releasing plate is transformed by heat stress. Thereby, variation occurs in the distribution of heat releasing material, and the heat releasing property of the power semiconductor device deteriorates.

SUMMARY OF THE INVENTION

According to one aspect, there is provided a semiconductor device including: a semiconductor chip; a heat releaser; a laminate substrate including an electrical insulating board, a circuit board formed on a front surface of the electrical insulating board, and a metal plate formed on a back surface of the electrical insulating board, the semiconductor chip being mounted on the circuit board; and a heat releasing plate having a front surface with which the metal plate of the laminate substrate is joined with a joint member in between, and a back surface with which the heat releaser is joined with heat releasing material in between, wherein a plurality of depressions are formed to overlap each other in at least one of a first joining region of the back surface of the heat releasing plate with which the heat releaser is joined, a second joining region of the metal plate of the laminate substrate with which the heat releasing plate is joined, and a third joining region of the front surface of the heat releasing plate with which the metal plate of the laminate substrate is joined.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
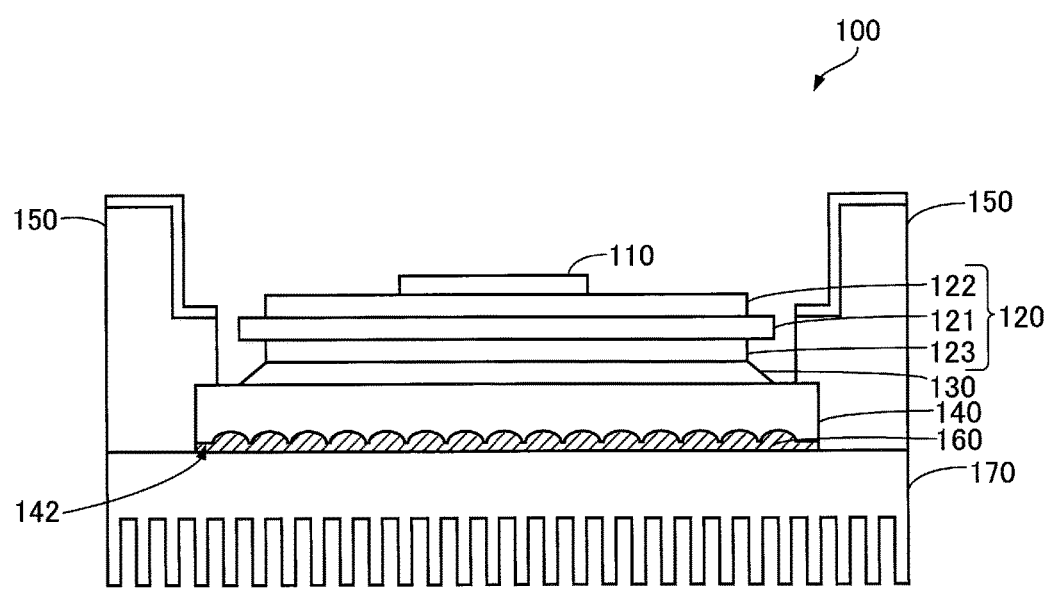
FIG. 1 illustrates a semiconductor device in a first embodiment.

Several embodiments will be described below with reference to the accompanying drawings, wherein like reference numerals refer to like elements throughout.

First Embodiment

First, a semiconductor device will be described with reference to FIGS. 1 and 2.

FIG. 1 illustrates a semiconductor device in a first embodiment.

Figure 2:
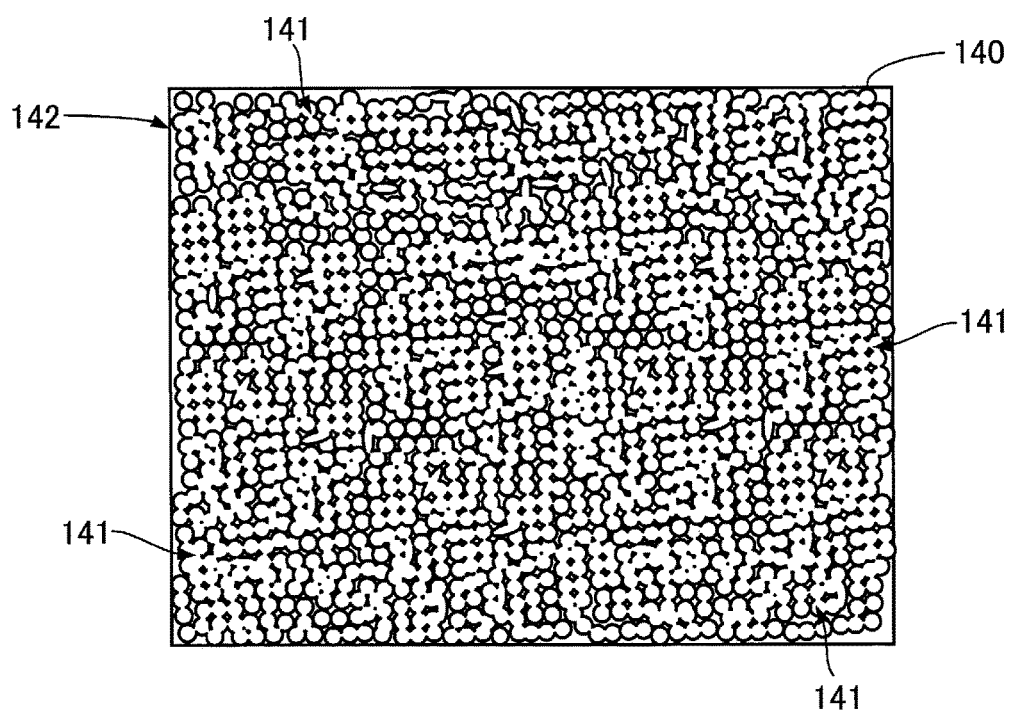
FIG. 2 illustrates a back surface of a heat releasing plate of a semiconductor device in the first embodiment.

FIG. 2 illustrates a back surface of a heat releasing plate of the semiconductor device in the first embodiment.

A semiconductor device 100 includes a semiconductor chip 110, a laminate substrate 120, and a heat releasing plate 140 stacked and contained in a case 150. In the case 150, the semiconductor chip 110, the laminate substrate 120, and a front surface side of the heat releasing plate 140 are encapsulated by resin (not illustrated).

The semiconductor chip 110 includes a semiconductor element, such as an insulated gate bipolar transistor (IGBT), a power metal oxide semiconductor field effect transistor (MOSFET), and a freewheeling diode (FWD), for example. Although FIG. 1 illustrates only one semiconductor chip 110, a plurality of semiconductor chips may be mounted if need be.

The laminate substrate 120 includes an electrical insulating board 121, a circuit board 122 formed on a front surface of the electrical insulating board 121, and a metal plate 123 formed on a back surface of the electrical insulating board 121. The electrical insulating board 121 is made of alumina, silicon nitride, aluminum nitride, or the like. The circuit board 122 is made of metal, such as copper, which has electrical conductivity, for example. The metal plate 123 is made of metal, such as aluminum, gold, silver, or copper, which has a high thermal conductivity. Also, the semiconductor chip 110 is mounted on the circuit board 122 of the laminate substrate 120 with a joint member (not illustrated), such as solder, in between. The joint member may be conventional solder material. The joint member may be cream solder or plate solder. Also, the joint member may be conductive joint material containing silver particles and copper particles. Also, the conductive joint material may be sintered.

The heat releasing plate 140 is made of metal such as aluminum, gold, silver, or copper, which has a high thermal conductivity. The laminate substrate 120 is provided on the front surface of the heat releasing plate 140 with a joint member 130, such as solder material, in between. Also, a protective film made of nickel or the like may be formed on the surface of the heat releasing plate 140, to improve its corrosion resistance. The protective film may employ chromium, gold, or the like, instead of nickel. The protective film is formed by sputtering, chemical vapor deposition (CVD), or plating. Also, as illustrated in FIG. 2, a plurality of small depressions 141 are formed to overlap each other in a first joining region 142 of the back surface of the heat releasing plate 140 with which a heat releaser 170 is joined as described later. The detail of a method for forming the depressions in the first joining region 142 of the back surface of the heat releasing plate 140 will be described later.

Note that wires (not illustrated) electrically interconnect between the semiconductor chips 110 and between a main electrode of the semiconductor chip 110 and a terminal of the case 150.

In the semiconductor device 100 having the above configuration, the heat releaser 170 is provided on the back surface of the heat releasing plate 140 with heat releasing material 160, such as thermal compound, in between. The heat releaser 170 is made of metal, such as aluminum, gold, silver, or copper, which has a high thermal conductivity, for example. The heat releaser 170 is attached to the back surface of the heat releasing plate 140 by screws (not illustrated) with the heat releasing material 160 in between. The heat releasing material 160 is filled in a small gap between the heat releasing plate 140 and the heat releaser 170 to smoothly transmit heat between the heat releasing plate 140 and the heat releaser 170.

Note that the heat releasing material 160 includes non-silicone organic oil and filler (for example, alumina) contained in the organic oil, for example. Note that silicone series may be used as the organic oil. Also, the filler is used to improve heat conduction, and aluminum nitride, zinc oxide, or the like is used as the filler. Note that the filling rate of the filler is 80 wt % or more and 95 wt % or less, and the average particle diameter of the filler is 0.1 µm or more and 20 µm or less, and the average is approximately 5 µm. Also, the thermal conductivity of the heat releasing material 160 is 1.99 W/(m·K), and the viscosity of the heat releasing material 160 is 542 Pa·s (at the rotational speed of 0.3 rpm) and 112 Pa·s (at the rotational speed of 3 rpm). The heat releasing material 160 having the thickness of approximately 100 µm is applied to the heat releasing plate 140.

In the semiconductor device 100, a plurality of small depressions 141 are formed to overlap each other in the first joining region 142 of the back surface of the heat releasing plate 140 with which the heat releaser 170 is joined. The above small depressions 141 are formed to overlap each other on the heat releasing plate 140 on which a streaky scratch or the like is created in the first joining region 142 of the back surface. Thereby, the scratch of the back surface is removed or reduced. In particular, the streaky scratch is removed.

Also, the hardness of the first joining region 142 of the back surface increases, when the above small depressions 141 are formed in the first joining region 142 of the back surface of the heat releasing plate 140 with which the heat releaser 170 is joined. Hence, the scratch is prevented from being created in the first joining region 142 of the heat releasing plate 140 on which the depressions 141 are formed to overlap each other in the first joining region 142 of the back surface. Even if the scratch is created in the first joining region 142 of the back surface of the heat releasing plate 140 on which the depressions 141 are formed to overlap each other in the first joining region 142 of the back surface, the small depressions 141 overlap each other and spread evenly in all directions in the first joining region 142 of the back surface. Hence, the created scratch is reduced and does not become a continuous groove (streaky scratch).

As described above, the scratch created in the first joining region 142 of the back surface of the heat releasing plate 140 is reduced. Hence, when the heat releaser 170 is attached to the heat releasing plate 140 with the heat releasing material 160 in between, an air gap due to the scratch is reduced. Further, pumping out occurring along the scratch is prevented. Thus, deterioration of the heat releasing property of the semiconductor device 100 is prevented.

Next, in the following, the detail of a method for forming a plurality of depressions 141 in the first joining region 142 of the back surface of the heat releasing plate 140 will be described.

First, a method for forming a plurality of depressions in the first joining region 142 of the back surface of the heat releasing plate 140 will be described with reference to FIGS. 3A and 3B.

Figure 3A:
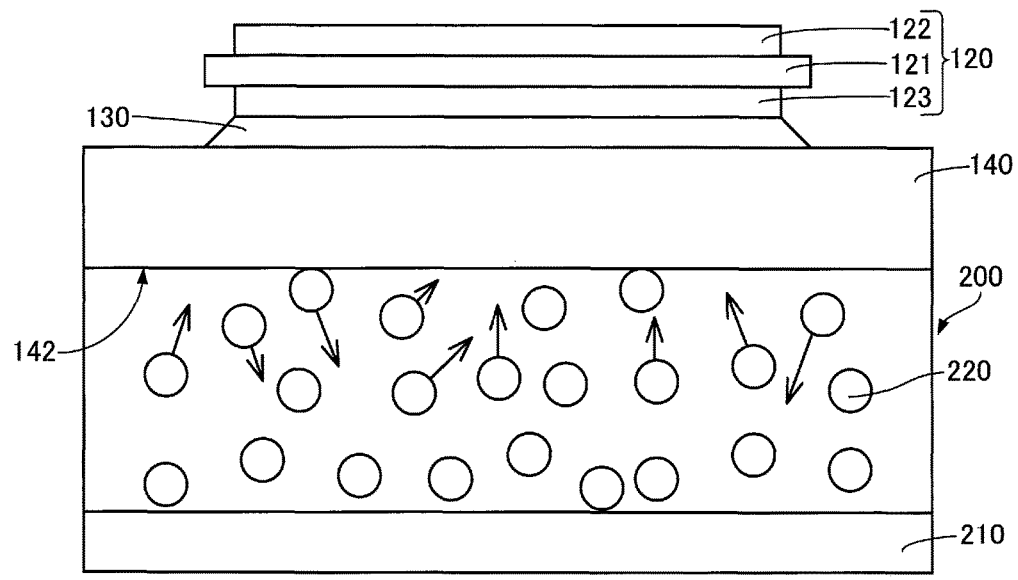
FIGS. 3A and 3B are diagrams for describing a shot peening process in the first embodiment.
Figure 3B:
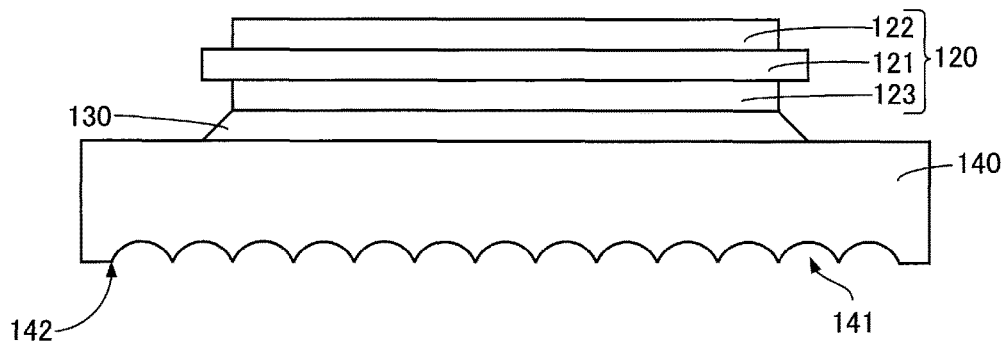

FIGS. 3A and 3B are diagrams for describing a shot peening process in the first embodiment.

Note that FIG. 3A illustrates a diagram for describing the shot peening process, and FIG. 3B illustrates a diagram for describing the heat releasing plate 140 on which the shot peening process is performed.

By the shot peening (SP) process, a plurality of depressions 141 are formed in the first joining region 142 of the back surface of the heat releasing plate 140 of the semiconductor device 100.

For example, as illustrated in FIG. 3A, a shot peening processing device 200 is installed for the first joining region 142 of the back surface of the heat releasing plate 140, in order to perform the shot peening process on the first joining region 142 of the back surface of the heat releasing plate 140.

The shot peening processing device 200 includes an ultrasonic vibration device 210 and a plurality of shots 220 vibrated by the ultrasonic vibration device 210.

In the shot peening processing device 200, the shots 220 are vibrated by driving the ultrasonic vibration device 210. The vibrated shots 220 are struck against the first joining region 142 of the back surface of the heat releasing plate 140. Thereby, as illustrated in FIG. 3B, a plurality of depressions 141 are formed in the first joining region 142 of the back surface of the heat releasing plate 140, so as to overlap each other. Also, the hardness increases in the processed region of the heat releasing plate 140 on which the shot peening process is performed as described above.

In the shot peening processing device 200, the depression width, the depth, etc. of the depressions 141 are controlled by setting various processing conditions, to control the hardness of the processed region of the heat releasing plate 140.

The shots 220 are made of metal (including metal alloy), ceramics, glass, or the like, for example. Also, the average particle diameter of the shots 220 is 0.5 mm or more and 3 mm or less, for example. Note that the detail of the average particle diameter of the shots 220 will be described later. Also, the average particle diameter of the shots 220 is obtained by observing each shot 220 by a scanning electron microscope (SEM), measuring the particle diameters, and calculating their average. Specifically, the particle image by the SEM observation is approximated by a circle, and its diameter is measured as the particle diameter. The shapes of the shots 220 may be angular shape or spherical shape.

Also, as already described, a protective film is formed on the surface of the heat releasing plate 140. Hence, the shot peening process may be performed on the heat releasing plate 140 before the protective film is formed, and may be performed on the heat releasing plate 140 after the protective film is formed on the surface of the heat releasing plate 140. It is preferable that each shot for performing the shot peening process on the protective film formed on the surface of the heat releasing plate 140 have a spherical shape. This is because, if the angular shots are utilized in the shot peening process onto the protective film, a crack is created in the protective film, causing flaking off or the like.

Also, the ultrasonic wave amplitude by the ultrasonic vibration device 210 is set to 35 μm, 55 μm, 70 μm, or 80 μm for example, by using the shots 220 having the average particle diameter in the above range, and the vibration time (the processing time) is set to 5 seconds, 10 seconds, 15 seconds, 20 seconds, or 100 seconds, for example. By combining these conditions, the number, the size, etc. of the depressions 141 formed on the back surface of the heat releasing plate 140 are controlled as appropriate. Also, it is preferable that the amplitude be 50 μm or more and 80 μm or less, from the viewpoint of productivity, because the processing time is made shorter.

However, in the scratch removing shot peening process, the average particle diameter of the shots 220, the ultrasonic wave amplitude, and the vibration time are selected to harden the back surface of the heat releasing plate 140 to an extent that deflection hardly occurs in the heat releasing plate 140.

The average particle diameter of the shots 220, the ultrasonic wave amplitude, and the vibration time are selected as appropriate so as to make the hardness of the first joining region 142 of the heat releasing plate 140 higher than when the scratch removing shot peening process is performed. Thus, the depressions deeper than the case of the scratch removing shot peening process overlap each other on the back surface of the heat releasing plate 140. The region in which the depressions are formed to overlap each other on the back surface of the heat releasing plate 140 increases its volume. Accordingly, a deeper work hardened layer is formed by hardening the back surface of the heat releasing plate 140 than the case of the scratch removing shot peening process. This work hardened layer has a thickness from several microns to several ten microns in the plate thickness direction of the heat releasing plate 140. Thus, compression stress acts in the region on which the shot peening process is performed, and the heat releasing plate 140 deflects. Specifically, a shape protruding downwardly (concave shape) is created, with the work hardened layer on the lower side. Also, the depth, the width, the number, etc. of the depressions 141 formed on the back surface of the heat releasing plate 140 are controlled by changing the amplitude of the ultrasonic vibration, the shape and the average particle diameter of the shots, etc. For example, initial deflection is given to the heat releasing plate 140 by the deflection causing shot peening process.

Also, deflection is generated, when the semiconductor chip 110, the laminate substrate 120, and the heat releasing plate 140 are heated and joined by the joint member. Thus, the generated deflection is corrected and made flat, by performing the deflection causing shot peening process after the heating and joining.

Here, the depressions 141 formed on the heat releasing plate 140 by the shot peening process will be described with reference to FIG. 4.

Figure 4:
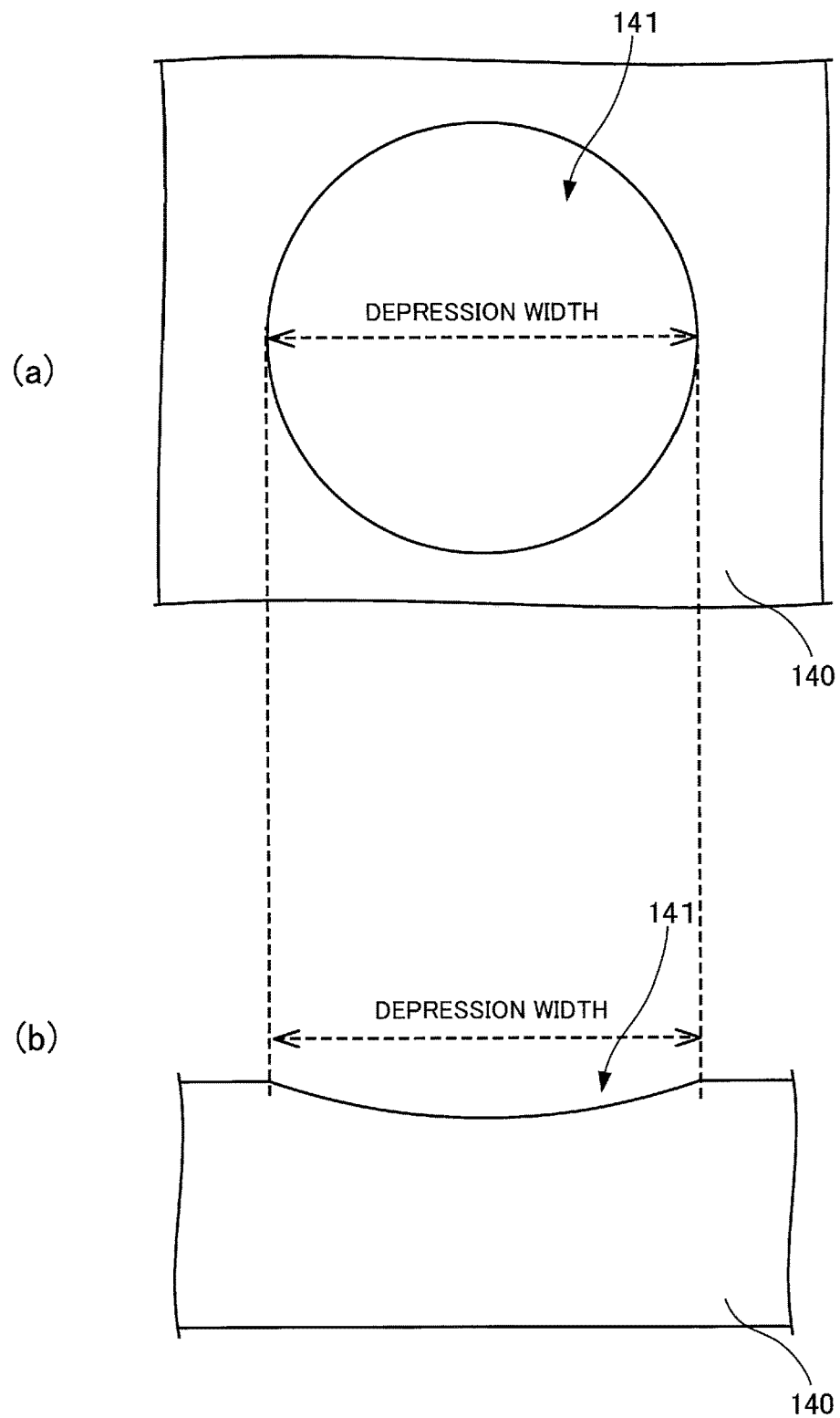
FIG. 4 is a schematic diagram of a SEM image of a depression formed in a heat releasing plate by a shot peening process in the first embodiment.

FIG. 4 is a schematic diagram of a SEM image of a depression formed in the heat releasing plate by the shot peening process in the first embodiment.

FIG. 4(a) is a schematic diagram of a SEM image of the upper surface of one depression 141 formed in the heat releasing plate 140 by the shot peening process, and FIG. 4(b) is a schematic diagram of the SEM image of the cross section of the one depression 141.

When the shot peening process is performed for a short time to the flat heat releasing plate 140, the shots 220 collide with the back surface of the heat releasing plate 140, and the depressions 141 are formed as processing indentations in a dispersed manner without overlapping each other. One depression 141 is formed to transfer the shape of the shot 220. Thus, if the shot 220 has a spherical shape, the depression 141 forms a part of the sphere as illustrated in FIG. 4(a). The cross section of the depression has a circular arc shape as illustrated in FIG. 4(b). Here, the width of the depression 141 is referred to as depression width. When a large number of shots 220 collide, a finished surface including the spherical depressions 141 located evenly in all directions to overlap each other is formed.

Next, a method of manufacturing the semiconductor device 100 including the heat releasing plate 140 on which the shot peening process is performed will be described with reference to FIG. 5.

Figure 5:
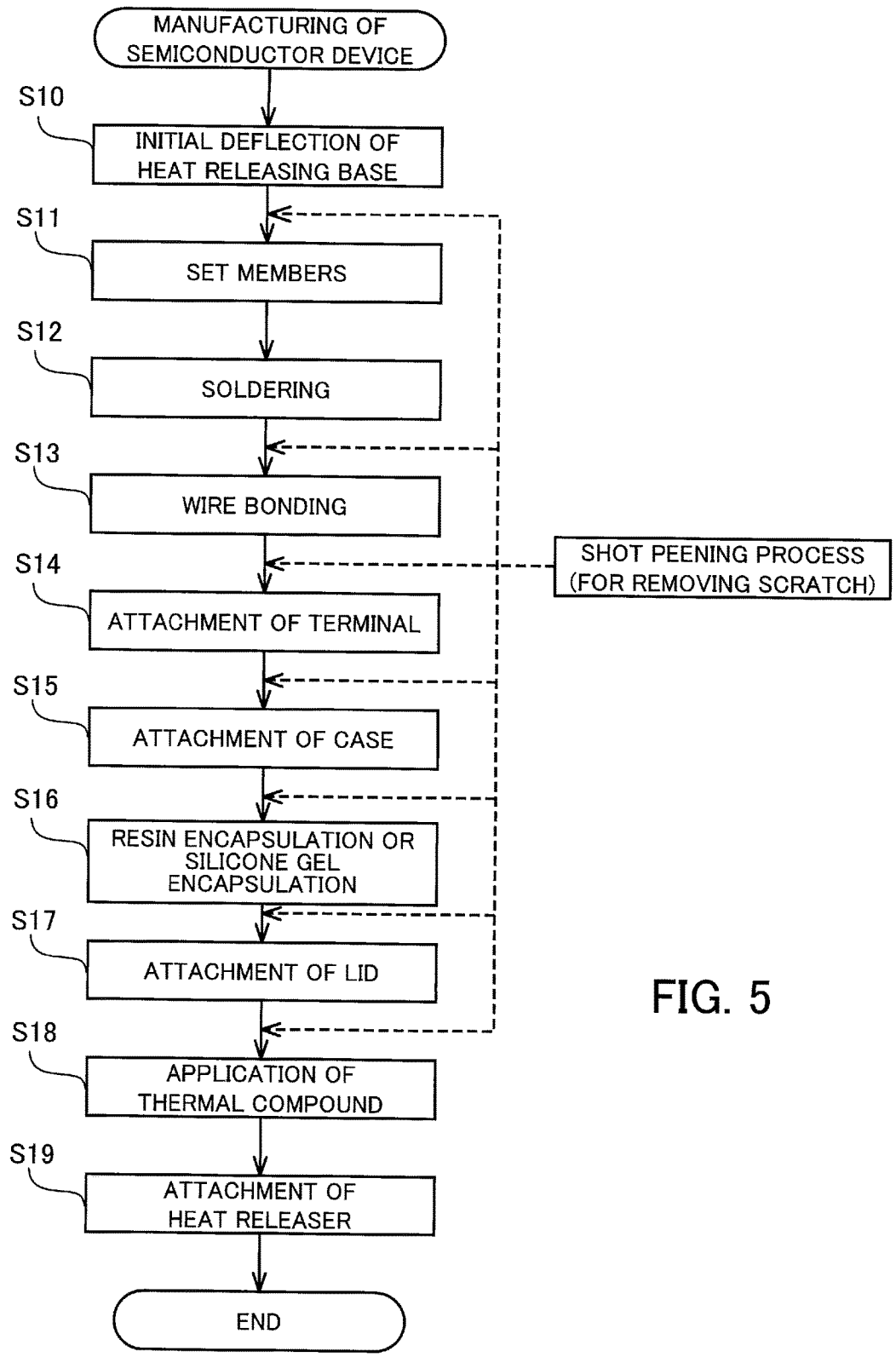
FIG. 5 is a flowchart illustrating a method of manufacturing a semiconductor device in the first embodiment.

FIG. 5 is a flowchart illustrating a method of manufacturing the semiconductor device in the first embodiment.

Note that a scratch removing shot peening process step will be described after the description of the method of manufacturing the semiconductor device 100.

[Step S10] Initial deflection is given to the heat releasing plate 140 to form the heat releasing plate 140 in a downwardly protruding shape (concave shape), for example. Note that this process may be skipped.

When the semiconductor chip 110, the laminate substrate 120, and the heat releasing plate 140 are later stacked with the solder in between, heated, and joined together by the solder, the heat releasing plate 140 deflects in an upwardly protruding shape, due to the difference in thermal expansion coefficient between those members. In anticipation of deflection of the heat releasing plate 140, such initial deflection is given to the heat releasing plate 140 in advance.

Note that the initial deflection of the heat releasing plate 140 is given to the back surface of the heat releasing plate 140, by performing the deflection causing shot peening process, as already described. Here, the conditions of the average particle diameter of the shots 220, the ultrasonic wave amplitude, and the vibration time are selected as appropriate.

[Step S11] The laminate substrate 120 is set on the heat releasing plate 140 with a plate-shaped joint member, such as a solder plate, in between, and the semiconductor chip 110 is set on the circuit board 122 of the laminate substrate 120 with a plate-shaped joint member in between.

[Step S12] The plate-shaped joint members located between the semiconductor chip 110, the laminate substrate 120, and the heat releasing plate 140 are heated and melted, and the melted joint members are solidified. Thereby, the semiconductor chip 110, the laminate substrate 120, and the heat releasing plate 140 are joined together.

When such soldering is performed, a single piece composed of the semiconductor chip 110, the laminate substrate 120, and the heat releasing plate 140 deflects in some cases. This deflection occurs due to the heat stress resulting from the linear expansion coefficient of the heat releasing plate 140 which is larger than that of the laminate substrate 120. In that case, the shot peening process may be performed to correct the heat releasing plate 140.

[Step S13] Wire bonding is performed to make an interconnection of the semiconductor chip 110.

[Step S14] Terminals are attached to the case 150.

[Step S15] The semiconductor chip 110, the laminate substrate 120, and the heat releasing plate 140, which are set in step S11, are contained in the case 150 and are bonded with the case 150, in order to assemble the semiconductor device 100.

Note that the back surface of the heat releasing plate 140 is exposed to the outside from the back surface side of the case 150.

[Step S16] The semiconductor chip 110, the laminate substrate 120, and the front surface of the heat releasing plate 140 are encapsulated in the case 150 by resin or silicone gel.

[Step S17] The terminals of the case 150 are bent to attach a lid.

[Step S18] The heat releasing material 160 having a thickness of 100 μm is applied to the back surface of the heat releasing plate 140.

[Step S19] The heat releaser 170 is attached to the back surface of the heat releasing plate 140 to which the heat releasing material 160 has been applied. The heat releaser 170 is fixed on the heat releasing plate 140 by screws.

As described above, the semiconductor device 100 to which the heat releaser 170 is attached is manufactured.

In the method of manufacturing the semiconductor device 100, the shot peening process step for removing a scratch from the heat releasing plate 140 may be performed after the initial deflection is given to the heat releasing plate 140 in step S10, and may be performed after one of steps S12 to S17. It is preferable that the scratch removing shot peening process be performed after step S10 or after step S17, from the viewpoint of prevention of influence on another process.

Next, the states (hardness, deflection, and roughness) of the first joining region 142 of the back surface of the heat releasing plate 140 in relation to various processing conditions in the scratch removing shot peening process on the heat releasing plate 140 will be described.

Various processing conditions, i.e., the average particle diameter of the shots 220, the processing time and the ultrasonic wave amplitude by the ultrasonic vibration device 210, are changed. Note that the back surface of the heat releasing plate 140 on which the scratch removing shot peening process is not performed is a flat surface. Also, the heat releasing plate 140 used is a copper plate having a vertical dimension of approximately 120 mm, a horizontal dimension of approximately 60 mm, and a thickness of approximately 3 mm.

First, change of the Vickers hardness ([Hv]) of the back surface of the heat releasing plate 140 in relation to the average particle diameter ([mm]) of the shots 220 will be described with reference to FIG. 6.

Figure 6:
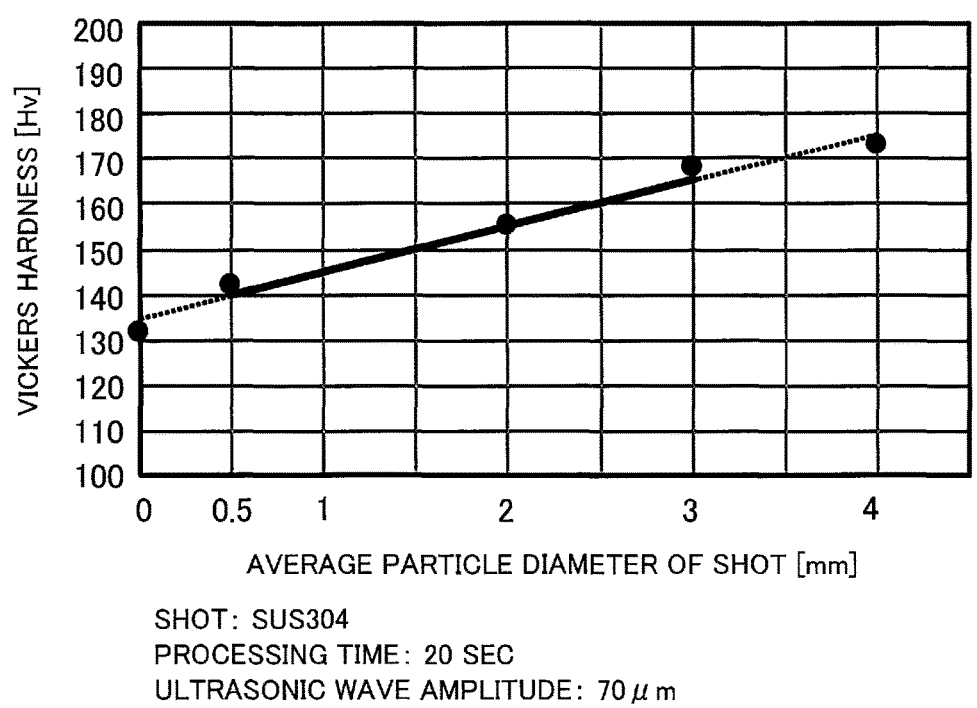
FIG. 6 is a graph indicating change of a Vickers hardness of a heat releasing plate of a semiconductor device in relation to an average particle diameter of shots in the first embodiment.

FIG. 6 is a graph indicating the change of the Vickers hardness of the heat releasing plate of the semiconductor device in relation to the average particle diameter of the shots in the first embodiment.

In FIG. 6, the horizontal axis indicates the average particle diameter ([mm]) of the shots 220, and the vertical axis indicates the Vickers hardness ([Hv]) of the entire back surface of the heat releasing plate 140.

Also, FIG. 6 illustrates a case in which the shot peening processing device 200 performs the scratch removing shot peening process, with the processing time of 20 seconds and the ultrasonic wave amplitude of 70 μm. Further, in this case, the Vickers hardness of the heat releasing plate 140 on which the scratch removing shot peening process is performed by using the shots 220 made of SUS304 and having the average particle diameters of 0 mm, 0.5 mm, 2 mm, 3 mm, and 4 mm, is measured. Note that the average particle diameter 0 mm means the Vickers hardness when the shot peening process is not performed.

According to the graph of FIG. 6, it is known that the Vickers hardness of the heat releasing plate 140 increases, as the average particle diameter of the shots 220 becomes larger.

Next, the change of the deflection ([μm]) of the first joining region 142 of the back surface of the heat releasing plate 140 in relation to the average particle diameter ([mm]) of the shots 220 will be described with reference to FIG. 7.

Figure 7:
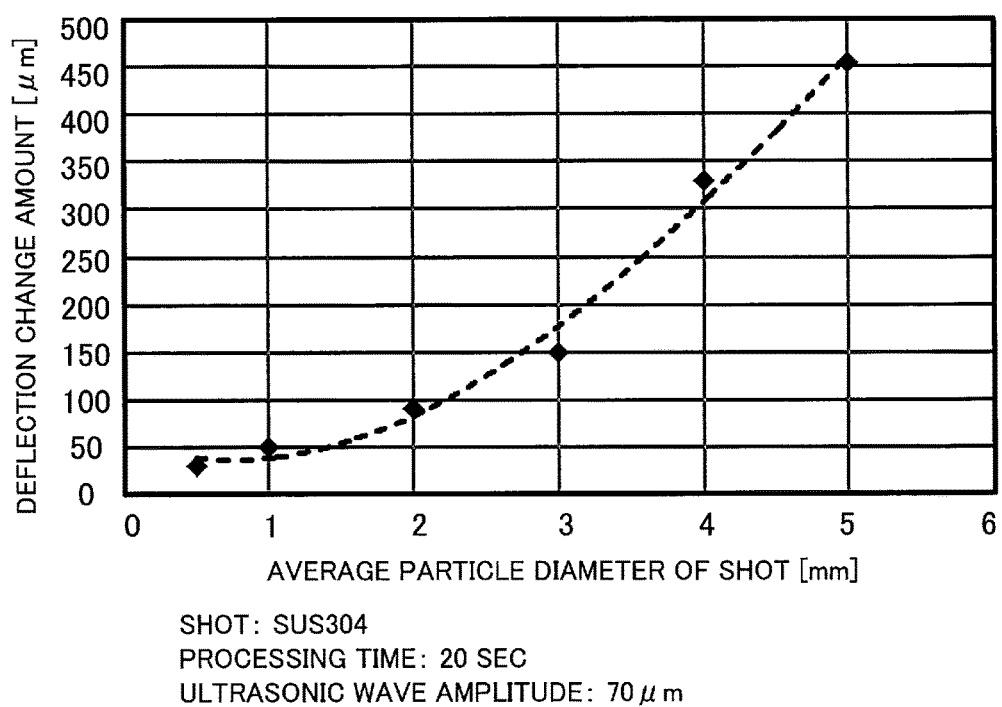
FIG. 7 is a graph indicating change of a deflection amount of a heat releasing plate of a semiconductor device in relation to an average particle diameter of shots in the first embodiment.

FIG. 7 is a graph indicating the change of the deflection amount of the heat releasing plate of the semiconductor device in relation to the average particle diameter of the shots in the first embodiment. Note that the maximum value of the displacement was measured by a laser displacement meter as a deflection change amount.

In FIG. 7, the horizontal axis indicates the average particle diameter ([mm]) of the shots 220, and the vertical axis indicates the deflection change amount ([μm]) of the first joining region 142 of the back surface of the heat releasing plate 140.

FIG. 7 also illustrates a case in which the shot peening processing device 200 performs the scratch removing shot peening process, with the processing time of 20 seconds and the ultrasonic wave amplitude of 70 μm. Further, in this case, the deflection change amount of the heat releasing plate 140 on which the scratch removing shot peening process is performed by using the shots 220 made of SUS304 and having the average particle diameters of 0.5 mm, 1 mm, 2 mm, 3 mm, 4 mm, and 5 mm, is measured.

According to the graph of FIG. 7, it is known that the deflection change amount of the heat releasing plate 140 increases, as the average particle diameter of the shots 220 becomes larger, in the range of the average particle diameter of the shots 220. In particular, it is known that, when the average particle diameter of the shots 220 exceeds approximately 2 mm, the deflection change amount of the heat releasing plate 140 sharply increases.

The heat releasing plate 140 is allowed to have an upper limit of the deflection change amount up to approximately 200 μm. That is, it is desirable that the average particle diameter of the shots be approximately 3 mm or less, in order to set the deflection change amount of the heat releasing plate 140 to approximately 200 μm or less.

Next, the change of the arithmetic average roughness Ra ([μm]) of the first joining region 142 of the back surface of the heat releasing plate 140 in relation to the average particle diameter ([mm]) of the shots 220 will be described with reference to FIG. 8.

Figure 8:
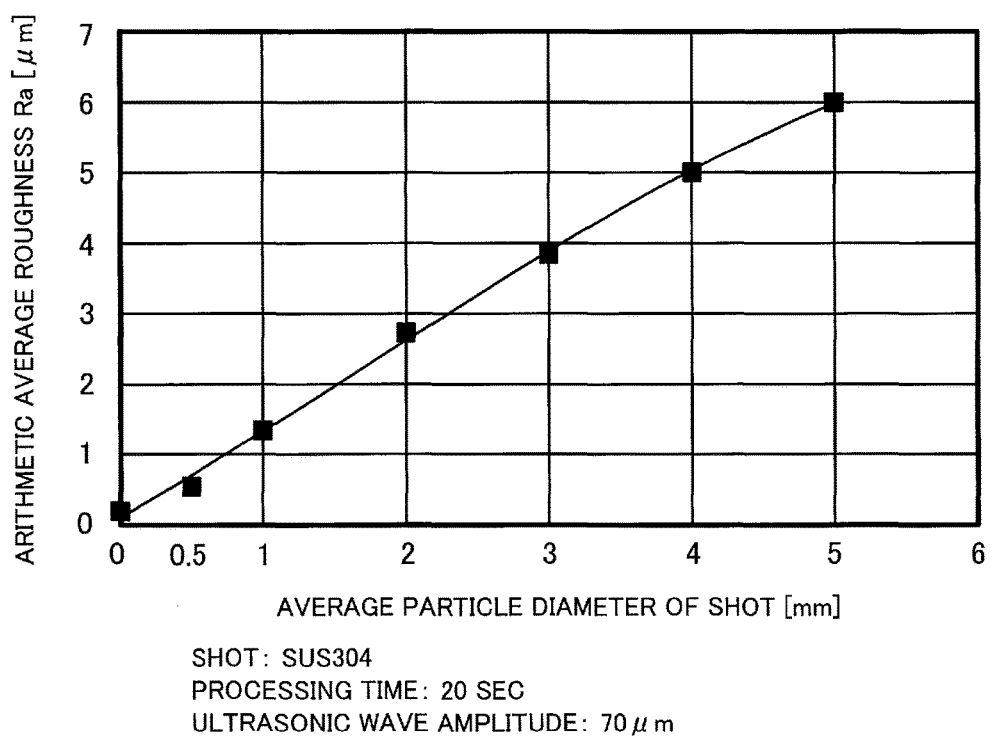
FIG. 8 is a graph indicating change of an arithmetic average roughness of a heat releasing plate of a semiconductor device in relation to an average particle diameter of shots in the first embodiment.

FIG. 8 is a graph indicating the change of the arithmetic average roughness of the heat releasing plate of the semiconductor device in relation to the average particle diameter of the shots in the first embodiment.

In FIG. 8, the horizontal axis indicates the average particle diameter ([mm]) of the shots 220, and the vertical axis indicates the arithmetic average roughness Ra ([μm]) of the first joining region 142 of the back surface of the heat releasing plate 140.

FIG. 8 also illustrates a case in which the shot peening processing device 200 performs the scratch removing shot peening process, with the processing time of 20 seconds and the ultrasonic wave amplitude of 70 μm. Further, in this case, the arithmetic average roughness Ra of the heat releasing plate 140 on which the scratch removing shot peening process is performed by using the shots 220 made of SUS304 and having the average particle diameters of 0.5 mm, 1 mm, 2 mm, 3 mm, 4 mm, and 5 mm, is measured.

According to the graph of FIG. 8, it is known that the arithmetic average roughness Ra of the heat releasing plate 140 increases, as the average particle diameter of the shots 220 becomes larger.

As described in FIG. 7, the maximum value of the average particle diameter of the shots 220 for performing the scratch removing shot peening process is approximately 3 mm. According to FIG. 8, the arithmetic average roughness Ra in this case is 4 μm.

When the arithmetic average roughness Ra of the heat releasing plate 140 is too large, the surface of the heat releasing material 160 becomes unlevel and non-flat. Hence, it is concerned that variation occurs in the distribution of the thickness of the heat releasing material 160, so that variation occurs in the heat releasing property.

Also, the scratch is unable to be removed, when the depressions 141 formed in the first joining region 142 of the back surface of the heat releasing plate 140 on which the scratch is formed in the first joining region 142 of the back surface are too small. Also, the scratch remains streaky, when the depressions 141 are too small, and the scratch is formed on the heat releasing plate 140 on which the depressions 141 are formed in the first joining region 142 of the back surface. Thus, in order to reduce such a scratch, the arithmetic average roughness Ra of the first joining region 142 of the back surface of the heat releasing plate 140 needs to be approximately 0.5 μm at least. Thus, in order to introduce such an arithmetic average roughness Ra, the average particle diameter of the shots 220 needs to be approximately 0.5 mm or more, as known from FIG. 8.

Thus, from FIGS. 6 to 8, when the shot peening processing device 200 operates with the processing time of 20 seconds and the ultrasonic wave amplitude of 70 μm, it is preferable that the average particle diameter of the shots 220 for performing the scratch removing shot peening process be 0.5 mm or more and 3 mm or less. The deflection change amount of the heat releasing plate 140 in the case of the above average particle diameter of the shots 220 is approximately 50 μm or more and approximately 200 μm or less. Also, the arithmetic average roughness Ra of the heat releasing plate 140 in the case of the above average particle diameter of the shots 220 is approximately 0.5 μm or more and approximately 4 μm or less. Moreover, it is more preferable that the arithmetic average roughness Ra be 1 μm or more and 3 μm or less.

As described above, the method of manufacturing the above semiconductor device 100 includes: a step for preparing the heat releasing plate 140; and an assembly step for joining the metal plate 123 side of the laminate substrate 120 including the electrical insulating board 121, the circuit board 122 formed on the front surface of the electrical insulating board 121, and the metal plate 123 formed on the back surface of the electrical insulating board 121, with the front surface of the heat releasing plate 140 with the joint member in between, and mounting the semiconductor chip 110 on the circuit board 122 of the laminate substrate 120. In addition, after preparing the heat releasing plate 140 or after the assembly step, the method of manufacturing the semiconductor device 100 includes: a step for performing the shot peening process on the first joining region 142 of the back surface of the heat releasing plate 140 with which the heat releaser 170 is joined; and a process for attaching the heat releaser 170 to the first joining region 142 of the heat releasing plate 140 with the heat releasing material 160 in between. In this shot peening process, the processing time is set to 20 seconds; the ultrasonic wave amplitude is set to 70 μm; the shots 220 are made of SUS304; and the average particle diameter is set to 0.5 mm or more and 3 mm or less. As a result, a plurality of small depressions 141 are formed to overlap each other in the first joining region 142 of the back surface of the heat releasing plate 140. Thereby, the heat releasing plate 140 has the deflection change amount of approximately 50 μm or more and approximately 200 μm or less, the arithmetic average roughness Ra of approximately 0.5 μm or more and approximately 4 μm or less, and the Vickers hardness of 140 Hv or more and 160 Hv or less.

Hence, the above small depressions 141 are formed to overlap each other in the heat releasing plate 140 on which a streaky scratch or the like is created in the first joining region 142 of the back surface. Thereby, the scratch of the first joining region 142 of the back surface is removed or reduced. Note that the above numerical values for the processing time and ultrasonic wave amplitude are an example, and the processing time and ultrasonic wave amplitude are not limited to these values. An equivalent effect may be obtained by the shot peening process using the shots 220 of a predetermined average particle diameter.

Also, as already described, when the shot peening process is performed on the first joining region 142 of the back surface of the heat releasing plate 140, the hardness of the first joining region 142 of the back surface increases. Hence, the scratch is prevented from being created in the first joining region 142 of the back surface of the heat releasing plate 140 on which the depressions 141 are formed to overlap each other in the first joining region 142 of the back surface. Even if the scratch is created in the first joining region 142 of the back surface of the heat releasing plate 140 on which the depressions 141 are formed to overlap each other in the first joining region 142 of the back surface, the small depressions 141 overlap each other and spread evenly in all directions in the first joining region 142 of the back surface. As a result, the created scratch is reduced and does not become a continuous groove.

As described above, the scratch created in the first joining region 142 of the back surface of the heat releasing plate 140 is reduced. Hence, when the heat releaser 170 is attached to the heat releasing plate 140 with the heat releasing material 160 in between, the air gap of the scratch is reduced, and the occurrence of pumping out is prevented. Thus, deterioration of the heat releasing property of the semiconductor device 100 is prevented.

Second Embodiment

A semiconductor device of a second embodiment will be described with reference to FIG. 9.

Figure 9:
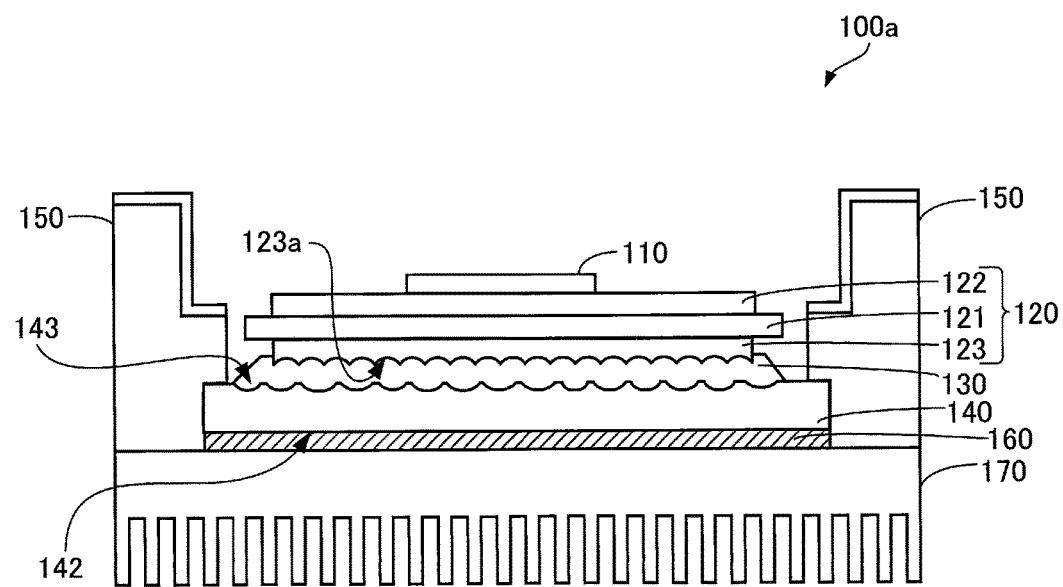
FIG. 9 illustrates a semiconductor device in a second embodiment.

FIG. 9 illustrates a semiconductor device in the second embodiment.

As illustrated in FIG. 9, a scratch removing shot peening process to a semiconductor device 100a is not performed on the first joining region 142 of the back surface of the heat releasing plate 140, but is performed on a second joining region 123a of the metal plate 123 of the laminate substrate 120 with which the heat releasing plate 140 is joined and to which the joint member 130, such as solder, is applied. Note that the second joining region 123a is a region of the metal plate 123 of the laminate substrate 120 with which the heat releasing plate 140 is joined. Thereby, the scratch in the second joining region 123a of the metal plate 123 of the laminate substrate 120 is reduced.

Also, the scratch removing shot peening process to the semiconductor device 100a may be performed on a third joining region 143 of the front surface of the heat releasing plate 140 with which the metal plate 123 side of the laminate substrate 120 is joined and to which the joint member 130, such as solder, is applied. Thereby, the scratch in the third joining region 143 of the front surface of the heat releasing plate 140 is reduced.

Thus, when the laminate substrate 120 is attached to the heat releasing plate 140 with the joint member 130, such as solder, in between, the fluctuation of the film thickness of the joint member 130, such as solder, due to the scratch is reduced, and the air gap is reduced to prevent outflow of the joint member 130, such as solder. Note that the third joining region 143 is a region of the heat releasing plate 140 with which the laminate substrate 120 is joined.

FIG. 9 illustrates a case in which the scratch removing shot peening process is performed on both of the third joining region 143 of the heat releasing plate 140 and the second joining region 123a of the metal plate 123 in the semiconductor device 100a. The embodiment is not limited to this case, but the scratch removing shot peening process may be performed on at least one of the second joining region 123a and the third joining region 143.

Also, according to the flowchart of the method of manufacturing the semiconductor device illustrated in FIG. 5, it is preferable that the scratch removing shot peening process be performed after both of the laminate substrate 120 and the heat releasing plate 140 are prepared (before step S12). Thereafter, the semiconductor chip 110, the laminate substrate 120, and the heat releasing plate 140, on which the scratch removing shot peening process is performed, are set (step S11), and the manufacturing process in and after step S12 is performed.

Also, the scratch removing shot peening process performed on the first joining region 142 as described in FIGS. 6 to 8 in the first embodiment is similarly performed on the second joining region 123a and the third joining region 143.

Also, the scratch removing shot peening process may be performed on the first joining region 142 of the back surface of the heat releasing plate 140 in the same way as the first embodiment, in addition to the second joining region 123a and the third joining region 143. Thereby, the scratch created in the first joining region 142 of the back surface of the heat releasing plate 140 is reduced.

Third Embodiment

A semiconductor device of a third embodiment will be described with reference to FIG. 10.

Figure 10:
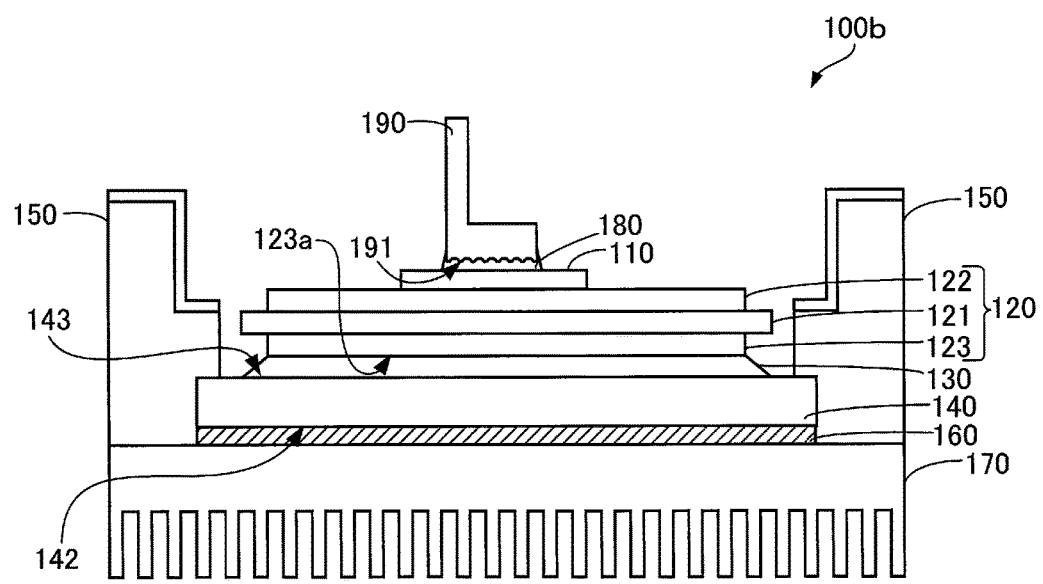
FIG. 10 illustrates a semiconductor device in a third embodiment.

FIG. 10 illustrates a semiconductor device in the third embodiment.

A semiconductor device 100b of the third embodiment includes a lead frame 190 joined with the semiconductor chip 110. In this case, as illustrated in FIG. 10, the scratch removing shot peening process is performed on a fourth joining region 191 of the lead frame 190 with which the semiconductor chip 110 is joined with a joint member 180, such as solder, in between. Thereby, the scratch in the fourth joining region 191 of the lead frame 190 is reduced.

Thus, when the lead frame 190 is attached to the semiconductor chip 110 with the joint member 180, such as solder, in between, the fluctuation of the film thickness of the joint member 180, such as solder, is reduced, and the air gap due to the scratch is reduced. Also, the outflow of the joint member 180, such as solder, is reduced. The occurrence of pumping out is prevented. Note that the above fourth region 191 is a region of the lead frame 190 with which the semiconductor chip 110 is joined.

Note that the semiconductor device 100b including the lead frame 190 needs to include the lead frame 190, the semiconductor chip 110, and the laminate substrate 120 at least.

Moreover, in the flowchart of the method of manufacturing the semiconductor device illustrated in FIG. 5, it is preferable that the scratch removing shot peening process be performed after the lead frame 190, the laminate substrate 120, and other members are prepared (before step S12). Thereafter, the fourth joining region 191 of the lead frame 190 on which the scratch removing shot peening process is performed is set, with the joint member 180 in between (step S11), on the semiconductor chip 110 set on the laminate substrate 120 with the joint member in between, and the manufacturing process in and after step S12 is performed.

Also, the scratch removing shot peening process performed on the first joining region 142 described in FIGS. 6 to 8 in the first embodiment is similarly performed on the fourth joining region 191.

Also, in addition to the case of FIG. 10, the scratch removing shot peening process is performed on at least one of the first joining region 142 of the back surface of the heat releasing plate 140, the second joining region 123a of the metal plate 123 of the laminate substrate 120, and the third joining region 143 of the front surface of the heat releasing plate 140, in the same way as the first and second embodiments. Thereby, the scratch created in the first joining region 142 of the back surface of the heat releasing plate 140, the second joining region 123a of the metal plate 123 of the laminate substrate 120, and the third joining region 143 of the front surface of the heat releasing plate 140, is reduced.

According to the disclosed technology, deterioration of the heat releasing property of the semiconductor device is prevented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor device, comprising:
a semiconductor chip;
a heat releaser;
a laminate substrate including
an electrical insulating board having a front surface and a back surface,
a circuit board having a front surface and a back surface, and being disposed on the front surface of the electrical insulating board, the semiconductor chip being mounted on the front surface of the circuit board, and
a metal plate disposed on the back surface of the electrical insulating board; and
a heat releasing plate having a front surface and a back surface, the metal plate of the laminate substrate being joined with the front surface of the heat releasing plate, via a joint member disposed therebetween, the heat releaser being joined with the back surface of the heat releasing plate, via a heat releasing material disposed therebetween, a plurality of depressions being formed so as to partially overlap one another in a plan view in at least one of a first joining region, a second joining region, and a third joining region, wherein
the first joining region is a region of the back surface of the heat releasing plate with which the heat releaser is joined,
the second joining region is a region of the metal plate of the laminate substrate with which the heat releasing plate is joined, and
the third joining region is a region of the front surface of the heat releasing plate with which the metal plate of the laminate substrate is joined.

2. The semiconductor device according to claim 1, wherein an arithmetic average roughness of the at least one of the first joining region, the second joining region, and the third joining region is in a range of 0.5 μm and 4 μm.

3. The semiconductor device according to claim 2, wherein a Vickers hardness of the at least one of the first joining region, the second joining region, and the third joining region is in a range of 140 Hv and 160 Hv.

4. The semiconductor device according to claim 3, wherein a deflection change amount of the heat releasing plate is in a range of 50 μm and 200 μm.

5. The semiconductor device according to claim 1, wherein the plurality of depressions is formed in each of the first joining region, the second joining region, and the third joining region.

* * * * *